(12) United States Patent
Petruccelli

(10) Patent No.: US 6,582,178 B2
(45) Date of Patent: Jun. 24, 2003

(54) MINI-MODUAL MANUFACTURING ENVIRONMENTAL

(76) Inventor: Daniel G. Petruccelli, 21 Ridge St., Methuen, MA (US) 01844

( * ) Notice: Subject to any disclaimer, the term of this patent is extended or adjusted under 35 U.S.C. 154(b) by 63 days.

(21) Appl. No.: 09/925,757

(22) Filed: Aug. 9, 2001

(65) Prior Publication Data

US 2002/0017013 A1 Feb. 14, 2002

Related U.S. Application Data

(60) Provisional application No. 60/225,071, filed on Aug. 14, 2000.

(51) Int. Cl.[7] .............................................. C23C 13/08
(52) U.S. Cl. .................. 414/749.2; 414/217; 198/690.1
(58) Field of Search ............................. 414/217, 217.1, 414/172, 749.2; 198/867.13, 690.1

(56) References Cited

U.S. PATENT DOCUMENTS

| | | | | |
|---|---|---|---|---|
| 1,053,368 A | * | 2/1913 | Eells ........................... | 104/155 |
| 3,202,406 A | * | 8/1965 | Tack ........................... | 432/239 |
| 4,231,294 A | * | 11/1980 | Arzoumanian ............ | 104/138.1 |
| 4,392,435 A | * | 7/1983 | Moody et al. .............. | 104/284 |
| 4,498,416 A | * | 2/1985 | Bouchaib .................... | 118/719 |
| 4,649,830 A | | 3/1987 | Tanaka | |
| 4,682,927 A | | 7/1987 | Southworth et al. | |
| 4,821,866 A | | 4/1989 | Melgaard | |
| 4,826,360 A | | 5/1989 | Iwasawa et al. | |
| 5,344,365 A | | 9/1994 | Scott et al. | |
| 5,408,935 A | * | 4/1995 | Matsui et al. .................. | 105/78 |
| 5,417,537 A | * | 5/1995 | Miller ......................... | 414/217 |
| 5,433,155 A | * | 7/1995 | O'Neill et al. .............. | 104/282 |
| 5,549,512 A | | 8/1996 | Sinclair et al. | |
| 5,564,339 A | * | 10/1996 | Miura et al. ................. | 104/156 |
| 5,713,791 A | | 2/1998 | Long et al. | |

\* cited by examiner

*Primary Examiner*—Eileen D. Lillis
*Assistant Examiner*—Charles A. Fox
(74) *Attorney, Agent, or Firm*—Tipton L. Randall

(57) ABSTRACT

A mini-modular manufacturing environmental chamber for processing and transporting semiconductor devices is disclosed. The cylindrical chamber is provided with a conveyer assembly that transports items within the chamber and divides the interior into two sections. Also included within the chamber are a power and control bus for process equipment located therein and a mounting assembly for securing the process equipment. Multiple environmental chambers can be connected by interconnect units and the chambers can be arranged in rows and columns to produce an array of manufacturing chambers useful for various semiconductor and microelectronic machine manufacture (MEMS) processing steps.

30 Claims, 7 Drawing Sheets

MINI-MODUAL MANUFACTURING ENVIRONMENTAL

CROSS-REFERENCE TO RELATED APPLICATIONS, IF ANY

This application claims the benefit under 35 U.S.C. §119 (e) of co-pending provisional application Serial No. 60/225,071, filed Aug. 14, 2000. Application Ser. No. 60/225,071 is hereby incorporated by reference.

STATEMENT REGARDING FEDERALLY SPONSORED RESEARCH OR DEVELOPMENT

Not applicable.

REFERENCE TO A MICROFICHE APPENDIX, IF ANY

Not applicable.

BACKGROUND OF THE INVENTION

1. Field of the Invention

The present invention relates to a modular manufacturing environmental chamber, and more particularly, to a modular manufacturing environmental chamber used for semiconductor manufacturing or microelectronic machine manufacturing (MEMS).

2. Background Information

The manufacture of semiconductor components and devices has seen many changes and innovations in recent years. As semiconductor devices have become smaller in size with greater circuit density, manufacturing methods require careful control of the environment where processing takes place to prevent contamination of the semiconductors by particulates. To address this problem, manufacturers have devised clean rooms where processing of semiconductors occurs. These clean rooms are expensive to prepare, maintain and operate, plus individuals entering the clean room must wear special clothing to prevent contamination of the work pieces. Also, moving semiconductor work pieces from one process to the next entails transporting devices that adds cost and complexity to the process.

A number of patents concerned with clean rooms and various conveyers and transfer systems have been granted. Tanaka, in U.S. Pat. No. 4,649,830, describes a tunnel for transferring semiconductor wafers that includes two tunnel zones. A carrier holding the wafer is located in one zone while a driving assembly in the second tunnel zone moves the attached carrier. Clean air flows into the zone containing the carrier and then to the zone with the driving assembly.

In U.S. Pat. No. 4,682,927, Southworth et al. disclose a conveyor system for transferring a cassette of semiconductor wafers between clean rooms. The system includes an elevator in each room that takes the cassette to a pressurized horizontal conveyer where the load moves on a driven cart which straddles, and is magnetically coupled to, an enclosed driver cart. FIG. 3 shows the details of the driver cart that magnetically moves the outer driven cart. Additionally, a turntable system for changing directions of travel is described and shown in FIGS. 12 and 13.

Iwasawa et al., in U.S. Pat. No. 4,826,360, describe a transfer system with a pod for containing a wafer cassette. The pod is located in a transfer tube and is moved by differences in air pressure within the tube. The tube is shown as being square.

In U.S. Pat. No. 4,821,866, Melgaard discloses a conveyer for clean rooms that includes parallel housings with moveable rods between the housings. The rods move by mechanical means within the housings. A negative pressure inside the housings pulls air and particles to the interior thereof.

Scott et al., in U.S. Pat. No. 5,344,365, disclose a circular semiconductor manufacturing facility with a central circular silo and surrounding clean rooms. The silo is used for storing and transferring wafers to clean rooms disposed radially around the silo at each floor. FIGS. 2 and 3 show wafer storage and transfer in the circular silo section.

Sinclair et al., in U.S. Pat. No. 5,549,512, describe a mini-environment for hazardous process tools. The enclosure permits open access to the work area from outside and prevents toxic substances from escaping the enclosure. A higher pressure region within the enclosure near the access aperture keeps particles out and toxic materials in. A pair of overlapping moveable plates with holes control air flow within the enclosure.

In U.S. Pat. No. 5,713,791, Long et al. disclose a clean room conduit that is modular to be adapted for various distances between multiple clean rooms. Each module system has a perforated floor for exhausting air and contaminants. Each module also has a filter for supplying recirculated clean air to the module. The modules have a conveyer track that hangs from the top and include a product carrier in a car assembly for transport of wafers in the product carrier.

Thus, there is an unmet need for a system that can economically process and transport semiconductor devices while maintaining controlled environment conditions to prevent contamination to these devices. Applicant has devised such a system which overcomes the difficulties encountered by the above inventions.

SUMMARY OF THE INVENTION

The invention is a modular manufacturing environmental chamber, including a hollow cylindrical member of selected outside diameter and length having an interior surface and an exterior surface, the cylindrical member with a longitudinal axis there through, and having first and second ends. Positioning members are secured to the cylindrical member exterior surface adjacent each end thereof, with the positioning members maintaining the cylindrical member in a static orientation. A chamber conveyor assembly is positioned within the hollow cylindrical member and includes a planar material movement plate member sized to linearly divide the hollow cylindrical member interior into a conveyer system section and a controlled environment section by contacting the cylindrical member interior surface with two opposite edges of the plate member. A pair of parallel, linear bumper rail members is affixed on the cylindrical member interior surface and parallel to the cylindrical member longitudinal axis for supporting the planar plate member. A conveyer system is secured to one surface of the planar plate member facing the conveyer system section, while a linear rail guide member is affixed to the opposite surface of the linear plate member facing the controlled environment section, with the linear rail guide member parallel to the cylindrical member longitudinal axis.

A linear power and control bus member is affixed on the cylindrical member interior surface within the controlled environment section, with the linear power and control bus member positioned parallel to the cylindrical member longitudinal axis. The linear power and control bus member is in electrical communication with devices exterior the cylindrical member. A means for connecting the hollow cylindrical member to other environmental chambers or for sealing the hollow cylindrical member to ambient environment is also present.

The invention also includes a modular manufacturing environmental chamber assembly comprising a plurality of modular manufacturing environmental chambers in communication by means of an interconnect chamber member having at least two open ends sealably connected to one open end of a hollow cylindrical member of a modular manufacturing environmental chamber. The interconnect chamber member includes an interconnect chamber conveyor assembly positioned within the interconnect chamber member, with the interconnect chamber conveyor assembly adapted for moving items from one modular manufacturing environmental chamber, through the interconnect chamber member and to another modular manufacturing environmental chamber.

DESCRIPTION OF THE PREFERRED EMBODIMENTS

Nomenclature

Figure 1:
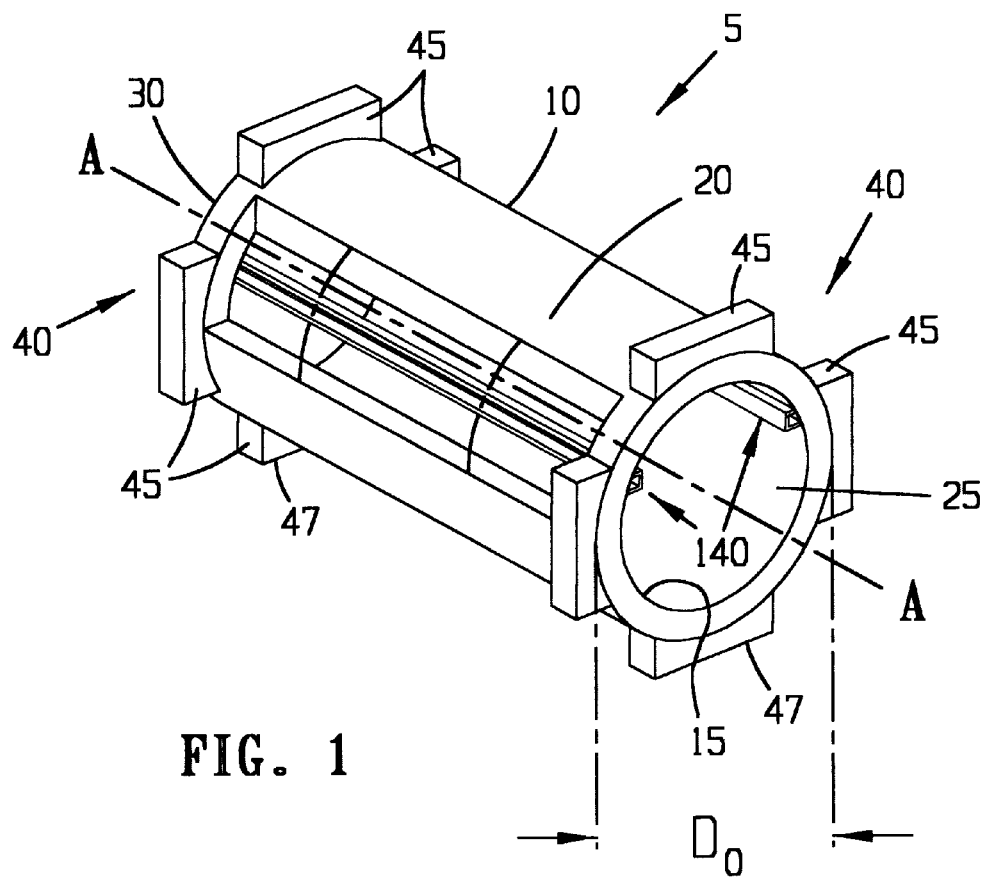
FIG. 1 is a perspective elevational view of an environmental chamber of one embodiment of the present invention.
Figure 2:
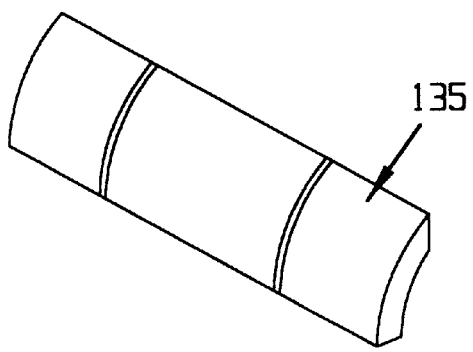
FIG. 2 is a perspective elevational view of a sealing access panel of one embodiment of the present invention.

5 Modular Manufacturing Environmental Chamber
10 Hollow Cylindrical Member
15 Interior Surface of Cylindrical Member
20 Exterior Surface of Cylindrical Member
25 First End of Cylindrical Member
30 Second End of Cylindrical Member
40 Cylinder Positioning Member
45 Positioning Block Members
47 Flat Surface of Block Members
50 Chamber Conveyer Assembly
55 Planar Material Movement Plate Member
60 Opposite Edges of Planar Plate Member
70 Conveyer System Section
80 Controlled Environment Section
90 Linear Bumper Rail Members
100 Conveyer System Assembly
110 Linear Rail Guide Member
120 Linear Power and Control Bus Member
122 Plug Members
124 Power Transformers
125 End Sealing Means
130 Flat Plate Sealing Member
135 Sealable Access Panel Member
140 Linear Elevational Locking Track Members
145 Mounting Apertures of Locking Track Members
150 Locking Bar Member
155 First End of Locking Bar Member
160 Second End of Locking Bar Member
165 Mounting Peg Members of Bar Members
170 Toothed Bar Members
175 Power Strip Members
180 DC Stepping Motors
185 Gear Member of Stepping Motor
200 End Conveyer Unit
205 Conveyer Belt Member
210 Belt Mounting Pulleys
215 DC Stepping Motors
220 Flat Surface of Belt Member
250 Central Conveyer Unit
255 Endless Conveyer Belt Member
260 Belt Mounting Pulleys
265 DC Stepping Motor
270 Flat Surface of Belt Member
1005 Interconnecting Environmental Chamber
1010 Hollow Cylindrical Member
1015 Interior Surface of Cylindrical Member
1020 Exterior Surface of Cylindrical Member
1025 First End of Cylindrical Member
1030 Second End of Cylindrical Member
1040 Cylinder Positioning Member
1045 Positioning Block Members
1047 Flat Surface of Block Members
1050 Chamber Conveyer Assembly
1055 Planar Material Movement Plate Member
1060 Opposite Edges of Planar Plate Member
1070 Conveyer System Section
1080 Controlled Environment Section
1090 Linear Bumper Rail Members
1100 Conveyer System Assembly
1110 Linear Rail Guide Member
1205 Interconnect Chamber Member
1210 Hollow Cylindrical Member
1215 Interior Surface of Cylindrical Member
1220 Exterior Surface of Cylindrical Member
1225 First End of Cylindrical Member
1226 First End of Cylindrical Member
1230 Second End of Cylindrical Member
1231 Second End of Cylindrical Member
1250 Chamber Conveyer Assembly
1255 Magnetically Driven Belt Member 1260 Belt Track Member
1270 Magnetic Solenoid Members
1280 Central Elevator Aperture
1405 Interconnect Chamber Member
1410 Hollow Cylindrical Member
1415 Interior Surface of Cylindrical Member
1420 Exterior Surface of Cylindrical Member
1425 First End of Cylindrical Member
1426 First End of Cylindrical Member
1427 First End of Cylindrical Member
1430 Second End of Cylindrical Member
1431 Second End of Cylindrical Member
1432 Second End of Cylindrical Member
1450 Chamber Conveyer Assembly
1455 Magnetically Driven Belt Member
1460 Belt Track Member
1470 Magnetic Solenoid Members
1480 Central Elevator Aperture
1490 Central Elevator Member
1495 Push Arm Member Construction In FIGS. 1–6, one embodiment of the present modular manufacturing environmental chamber invention is shown. Referring to FIG. 1, the modular manufacturing environmental chamber 5 includes a hollow cylindrical member 10 of selected length L, selected outside diameter $D_O$, and having an interior surface 15 and an exterior surface 20. The cylindrical member 10 has a longitudinal axis A there through, and the cylindrical member 10 has an open first end 25 and an open second end 30. Positioning members 40 are secured to the cylindrical member exterior surface 20 adjacent each end 25, 30, with the positioning members 40 maintaining the cylindrical member 10 in a static orientation.

The positioning members 40 preferably include a pair of block members 45, with one block member 45 at each end of the hollow cylindrical member 10. Each block member 45 of the pair has a mutually coplanar flat surface 47 opposite the cylindrical member exterior surface 20 for maintaining the cylindrical member 10 in a static orientation on a support surface. The pair of block members 45 support and elevate the cylindrical member 10 of the modular manufacturing environmental chamber 5 on a flat surface.

The positioning members 40 most preferably includes four pairs of block members 45, one block member 45 of each pair at each end of the hollow cylindrical member 10. Each pair of block members 45 has mutually coplanar flat surfaces 47, opposite the cylindrical member exterior surface 20, with each block member flat surface 47, opposite the cylindrical member exterior surface 20, oriented at 90 degrees to an adjacent block member flat surface 47 opposite the cylindrical member exterior surface 20. The block member flat surfaces 47 opposite the cylindrical member exterior surface 20 maintain the cylindrical member 10 in a static orientation relative to a support surface and to similar modular manufacturing environmental chambers 5 positioned adjacent thereto. The four pairs of block members 45 allow for formation of rows of modular manufacturing environmental chambers 5 on a support surface, as well as columns of modular manufacturing environmental chambers 5 stacked upon each other, thereby forming an array of modular manufacturing environmental chambers 5 for nanomanufacturing purposes.

Figure 3:
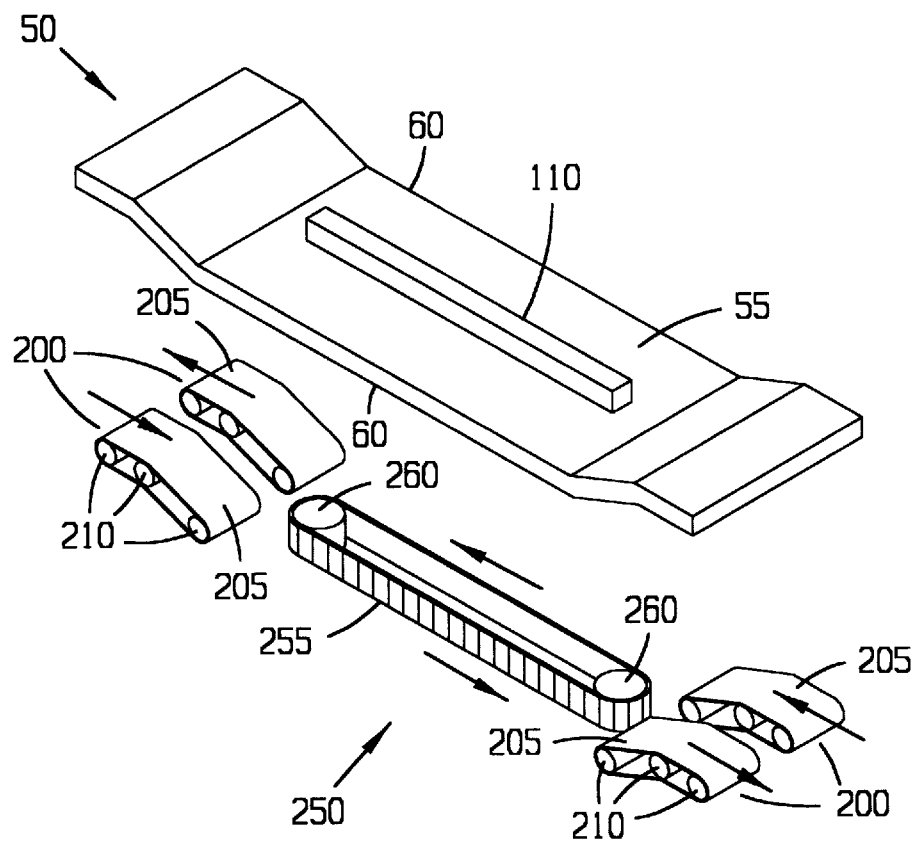
FIG. 3 is a perspective elevational view of the chamber conveyer assembly of one embodiment of the present invention.
Figure 4:
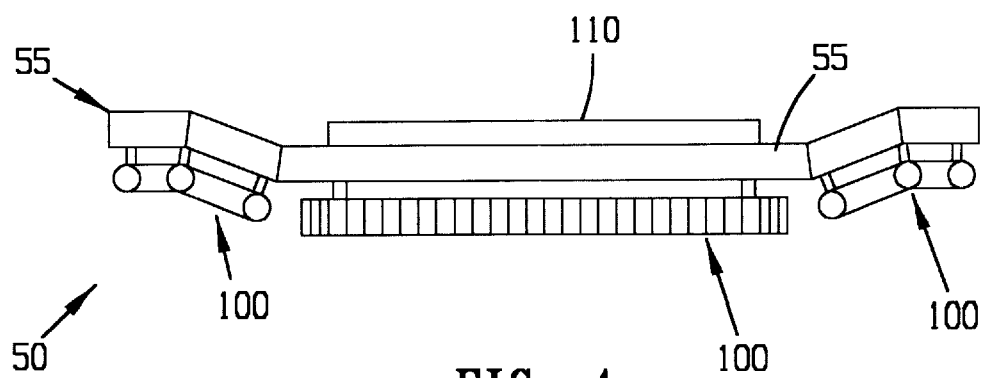
FIG. 4 is a side elevational view of the chamber conveyer assembly of FIG. 3.
Figure 5:
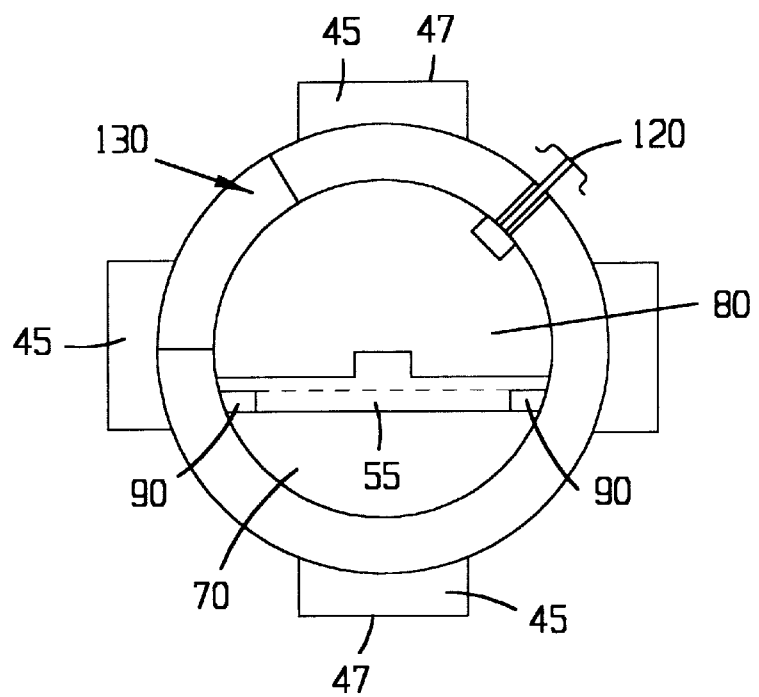
FIG. 5 is an end view of the environmental chamber with the planar plate member position therein.

Within each hollow cylindrical member 10 is positioned a chamber conveyer assembly 50, as shown in FIGS. 3 and 4. The conveyer assembly 50 includes a planar material movement plate member 55 sized to linearly divide the hollow cylindrical member interior volume into a conveyer system section 70 and a controlled environment section 80, as depicted in FIG. 5. Preferably the controlled environment section 80 is larger than the conveyer system section 70. The division of interior volume is achieved by contacting the cylindrical member interior surface 15 with two opposite edges 60 of the planar plate member 55. The planar plate member 55 is sized to extend the length L of the hollow cylindrical member 10 and is supported and held in position by a pair of parallel, linear bumper rail members 90 affixed on the cylindrical member interior surface 15 and parallel to the cylindrical member longitudinal axis A.

A conveyer system assembly 100 is secured to one surface of the planar plate member 55 facing the conveyer system section 70, and a linear rail guide member 110 is affixed to the opposite surface of the linear plate member 55 facing the controlled environment section 80. The linear rail guide member 110 is oriented parallel to the cylindrical member longitudinal axis A.

Figure 6:
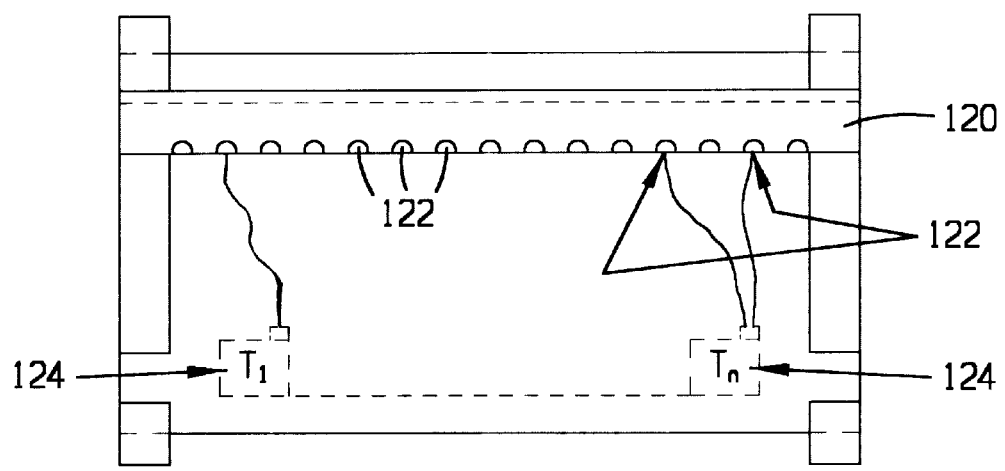
FIG. 6 is a side view of the environmental chamber showing the power and control bus with attached transformers of the present invention.

Referring to FIGS. 5 and 6, a linear power and control bus member 120 is shown in more detail. The bus member 120 contains multiple plug members 122 for providing electrical power, transmitting data to and from the chamber 5, and for controlling devices within the chamber 5. There is also provided electrical transformers 124 to supply suitably controlled electrical power to various power plugs on the bus member 120. The electrical transformers 124 are mounted exterior the chamber 5 so as to minimize impact on the environment control section 80 and for better heat dissipation from the transformers 124.

The linear power and control bus member 120 is affixed on the cylindrical member interior surface 15 within the controlled environment section 80. The linear power and control bus member 120 is also oriented parallel with the cylindrical member longitudinal axis A and in electrical communication with devices exterior the cylindrical member 10.

Also provided is a means 125 for sealing the hollow cylindrical member first end 25 and second end 30 to an ambient environment. The sealing means 125 may be a flat plate member 130, one fastened at each end of the hollow cylindrical member 10, or may include a connecting member 1005, described later, for interconnecting two or more modular manufacturing environmental chambers 5.

Referring again to FIGS. 1 and 2, the modular manufacturing environmental chambers 5 may also include a sealable access panel member 135 for gaining access to the hollow cylindrical member interior volume. The sealable access panel 135 comprises a removable radial section of the cylindrical member 10, extending a portion of the cylindrical member length L. The access panel 135 allows various third party devices to be conveniently inserted into and removed from the controlled environment section 80 of the interior volume of the hollow cylindrical member 10.

Figure 7:
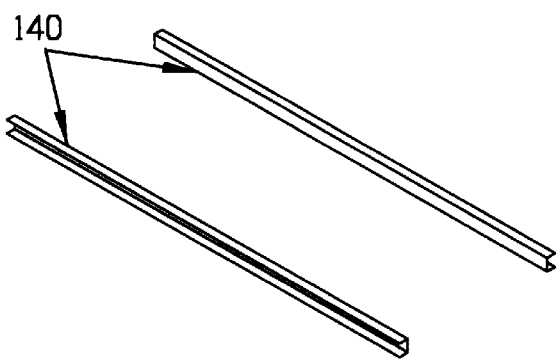
FIG. 7 is a perspective elevational partial view of the linear elevational locking track members of the present invention.
Figure 8A:
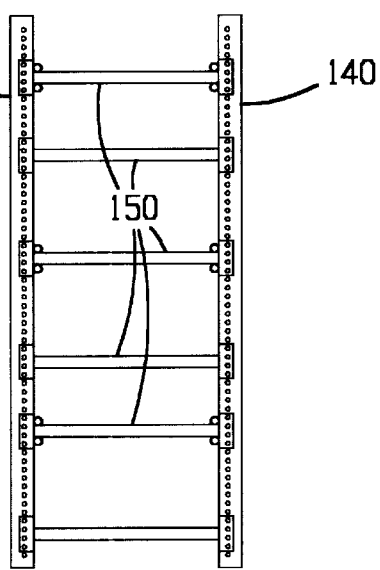
FIG. 8a is a top view of the mounting assembly including the locking tracks holding multiple locking bars.
Figure 8B:
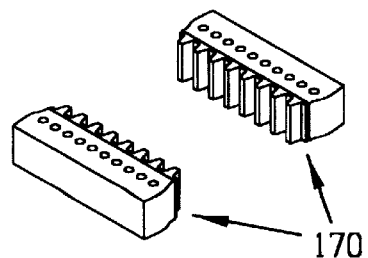
FIG. 8b is a closeup view of portions of the locking tracks of the present invention.
Figure 8C:
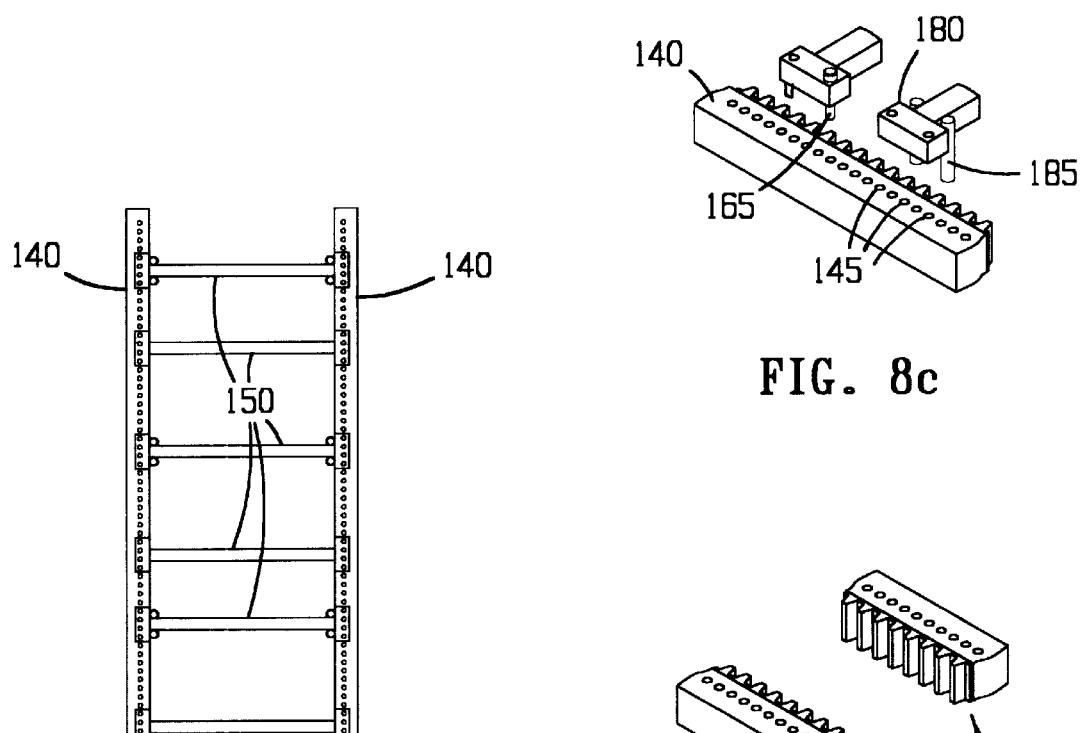
FIG. 8c is a closeup view of the ends of two different locking bars of the present invention.

Referring to FIGS. 7 and 8, a further embodiment of the present invention is shown. As seen in FIG. 7, a pair of parallel, linear elevational locking track members 140 are affixed on the cylindrical member interior surface 15 within the controlled environment section 80. The linear elevational locking track members 140 are oriented parallel with the cylindrical member longitudinal axis A. FIG. 8 is atop view of the linear elevational locking track members 140, showing the mounting apertures 145 in each track member 140. Locking bar members 150, having a first end 155 and a second end 160, are adapted to connect at the first end 155 to one linear elevational locking track member 140 and at the second end 160 to the other linear elevational locking track member 140. The locking bar members 150 have mounting pegs 165 at each end that fit into corresponding mounting apertures 145 in each track member 140. Multiple locking bar members 150 can be mounted on track members 140 within a modular manufacturing environmental chambers 5. The locking bar members 150 can be manually positioned between the track members 140 at the desired locations.

In yet a further embodiment of the invention, the placement and movement of the locking bar members 150 on the track members 140 can be automated. Each track members 140 is provided with a toothed edge 170 opposite the cylindrical member interior surface 15, as shown in FIG. 8b. One or both track members 140 is provided with a power strip 175. The locking bar member 150 is provided a DC stepping motor 180, having a gear member 185 that engages the toothed edge 170 of the track member 140. Providing suitable current to the power strip 175 activates the stepping motor 180, turning the gear member 185 to move the locking bar member 150 in a selected direction. The locking bar member 150 does not have mounting pegs but is held in place by the gear member 185 of the stepping motor 180 secured to the locking bar member 150.

Again referring to FIGS. 3 and 4, the conveyer system assembly 100 is shown in detail. The assembly 100 includes two end conveyer units 200 and a central unit 250, each individually controlled. The central unit includes a single endless conveyer belt member 255 mounted around a pair of pulleys 260 that are rotatably secured to DC stepping motors 265 each secured to the surface of the planar plate member 55. The rotational axis of the pulleys 260 are perpendicular to the planar plate member 55 and centered under the linear rail guide member 110. The conveyer belt member 255 is preferably fabricated from an elastomeric material with magnetic properties. This feature allows items located on the side of the planar plate member 55 opposite the conveyer system assembly 100 to be moved by magnetic attraction to the conveyer belt 255, while maintaining a clean environment in the controlled environment section 80.

The conveyer belt member 255 is held with its larger flat surface 270 perpendicular to the surface of the planar plate member 55 facing the conveyer system section 70, and the belt member 255 is centered beneath the linear rail guide member 110. When the conveyer belt member 255 rotates, the belt member 255 moves only in one direction on each side of the linear rail guide member 110. Thus, items on one side of the linear rail guide member 110 move in one direction, while items on the other side of the linear rail guide member 110 move in the opposite direction.

The end conveyer units 200 are each composed of pairs of smaller conveyer belt members 205, each belt mounted on separate sets of pulleys 210, at least one of which is secured to a separate DC stepping motor 215. The pulleys 210 and DC stepping motor 215 are each secured to the surface of the planar plate member 55. The pairs of conveyer belt members 205 of each end unit 200 are mounted with a flat surface 220 parallel the planar plate member 55 and with one conveyer belt member 205 of the pair aligned with one side of the central unit conveyer belt member 255, and the other conveyer belt member 205 of the pair aligned with the other side of the central unit conveyer belt member 255. Each conveyer belt member 205 of an end unit pair moves in opposite directions and matches the direction of movement of the central unit conveyer belt member 255, with which each is aligned. Thus, items on one side of the linear rail guide member 110 move in one direction the full length of the planar plate member 55 and items on the opposite side of the liner rail guide member 110 move in the opposite direction the full length of the planar plate member 55.

Figure 9:
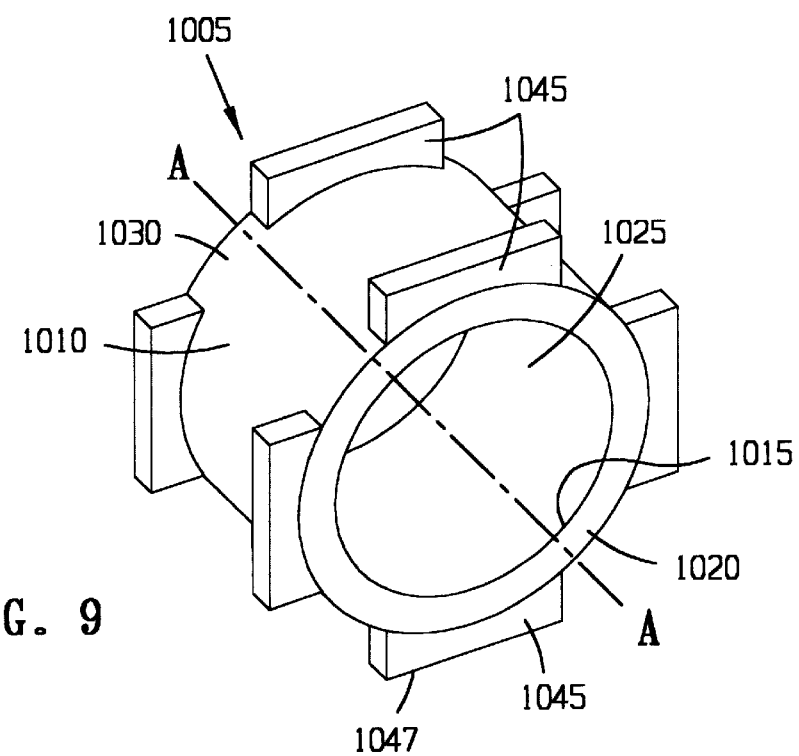
FIG. 9 is a perspective elevational view of a connecting chamber of one embodiment of the present invention.
Figure 10:
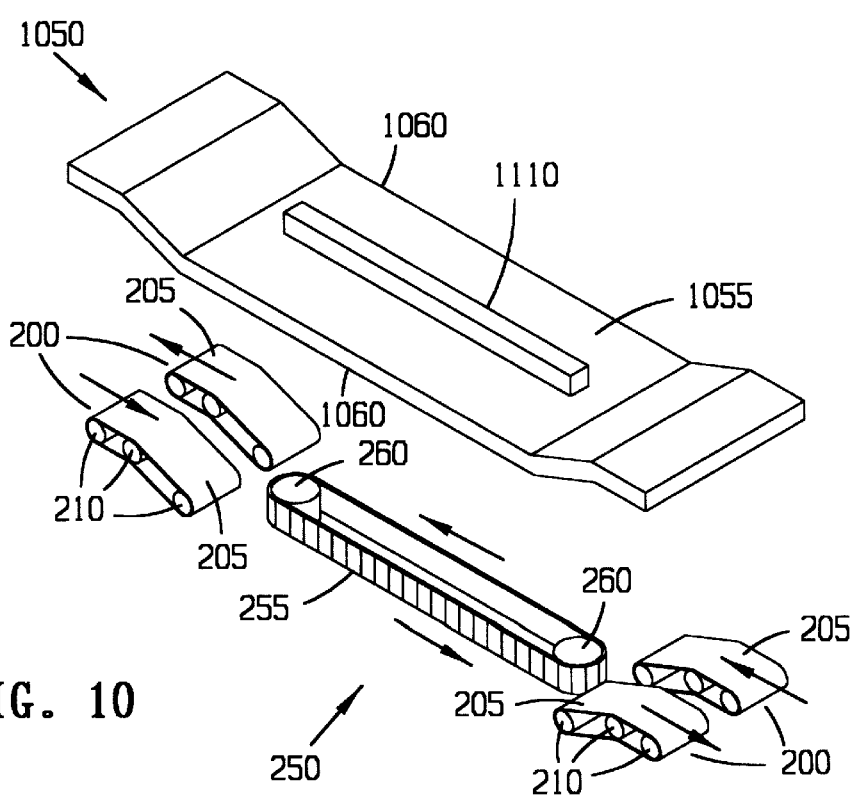
FIG. 10 is a perspective elevational view of the interconnect chamber conveyer assembly of one embodiment of the present invention.

In a further embodiment of the present invention, a two-way interconnect chamber member 1005 is shown in FIG. 9. The chamber 1005 includes a hollow cylindrical member 1010, having open ends 1025 and 1030 that are sized to connect with either of the open ends 25 or 30 of the modular manufacturing environmental chamber 5 described above. Similar positioning members 1040 preferably include block members 1045 secured to the exterior surface 1020 of the interconnect chamber 1005 to hold the chamber 1005 in a static orientation and provide for placement of the chamber 1005 in rows and/or columns when connected to similarly configured modular manufacturing environmental chambers 5. Preferably, the block members 1045 include mutually coplanar flat surfaces 1047 opposite the cylindrical member exterior surface 1020.

A similar chamber conveyer assembly 1050 is present within each hollow cylindrical member 1010. The chamber conveyer assembly 1050 includes a planar material movement plate member 1055 sized to linearly divide the interconnect chamber hollow cylindrical member interior volume into a conveyer system section 1070 and a controlled environment section 1080. Preferably the controlled environment section 1080 is larger than the conveyer system section 1070. The division is achieved by contacting the cylindrical member interior surface 1015 with two opposite edges 1060 of the planar plate member 1055. The planar plate member 1055 is sized to extend the length L of the hollow cylindrical member 1010 and is supported and held in position by a pair of parallel, linear bumper rail members 1090 affixed on the cylindrical member interior surface 1015 and parallel to the cylindrical member longitudinal axis A, as shown in FIG. 5 for the chamber cylindrical member 10. A conveyer system assembly 1100 is secured to one surface of the planar plate member 1055 facing the conveyer system section 1070, and a linear rail guide member 1110 is affixed to the opposite surface of the linear plate member 1055 facing the controlled environment section 1080. The linear rail guide member 1110 is oriented parallel to the cylindrical member longitudinal axis A.

The interconnect chamber 1005 differs from the modular manufacturing environmental chamber 5 in that power for the conveyer system assembly 1100 is obtained from the modular manufacturing environmental chamber 5 to which the interconnect chamber 1005 is attached. Similarly, no linear power and control bus member is needed since the interconnect chamber 1005 functions to transport items there through and to change the direction and/or elevation of items traveling along a miniature manufacturing line. No end sealing means is needed either since another function of the interconnect chamber 1005 is to connect two modular manufacturing environmental chambers 5 which are sealed at their terminal ends.

Figure 11:
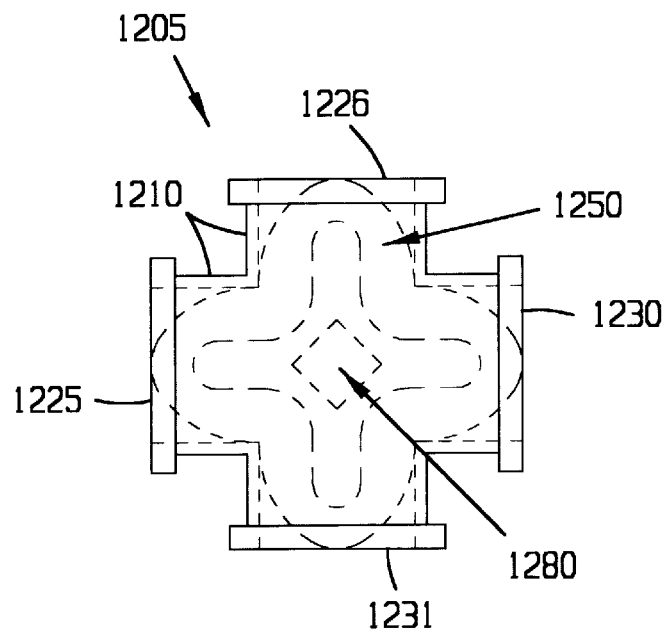
FIG. 11 is a cross sectional view of another connecting chamber of one embodiment of the present invention.

Referring now to FIG. 11, a bi-directional or four-way interconnect chamber member 1205 is shown from above in cross-sectional view. The interconnect chamber member 1205 includes two intersecting hollow cylindrical members 1210 each having opposed open ends 1225, 1230 and 1226, 1231, oriented at 90° relative to either adjacent open end. The open ends 1225, 1230 and 1226, 1231, are sized to sealably connect with either open end 25, 30 of a modular manufacturing environmental chamber 5 described above. No position members are required on the four-way interconnect chamber member 1205 since when in use, the chamber member 1205 is connected to at least two environmental chambers 5, each having cylinder position members 40, which provides support for the assembly. Any open end of the interconnect chamber member 1205 not connected to an environmental chamber 5 is sealed with an end sealing means 125 to close the assembly.

Figure 12:
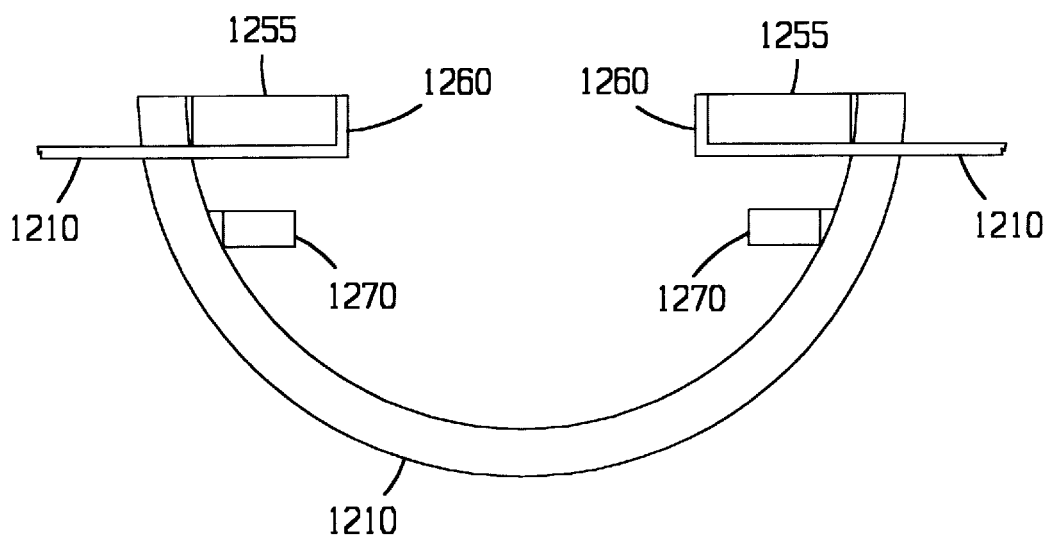
FIG. 12 is another cross sectional view of the connecting chamber of FIG. 11 of the present invention.

The interconnect chamber member 1205 contains a magnetically driven movement belt assembly 1250 which transfers work pieces from one interconnect chamber open end to any of the three other interconnect chamber open ends. The belt assembly 1250 includes a continuous flexible magnetically driven belt member 1255 that is fabricated from a solid composite material. The belt member 1255 is positioned at the same height as the material movement plate member 55 located in an attached modular manufacturing environmental chamber 5 described above. This alignment allows for facile movement of work pieces between the attached chamber 5 and the interconnect chamber 1205. The belt member 1255 is preferably fabricated from rubber or synthetic materials with the under side thereof containing uniform magnetic north/south zones. The belt member edges and under side are preferably coated with Teflon or other non-friction producing material, allowing the belt member 1250 to slide freely on a track member 1260 which shapes and limits belt member movement, as depicted in FIG. 11. A series of magnetic solenoids 1270 located below the track member 1260 in the interconnect chamber 1205 are used to control bi-directional movement of the belt member 1255, as illustrated in FIG. 12. The track assembly 1250 is designed with a central elevator aperture 1280 present, which is employed in a six-way interconnect chamber 1405, as described below.

Figure 13:
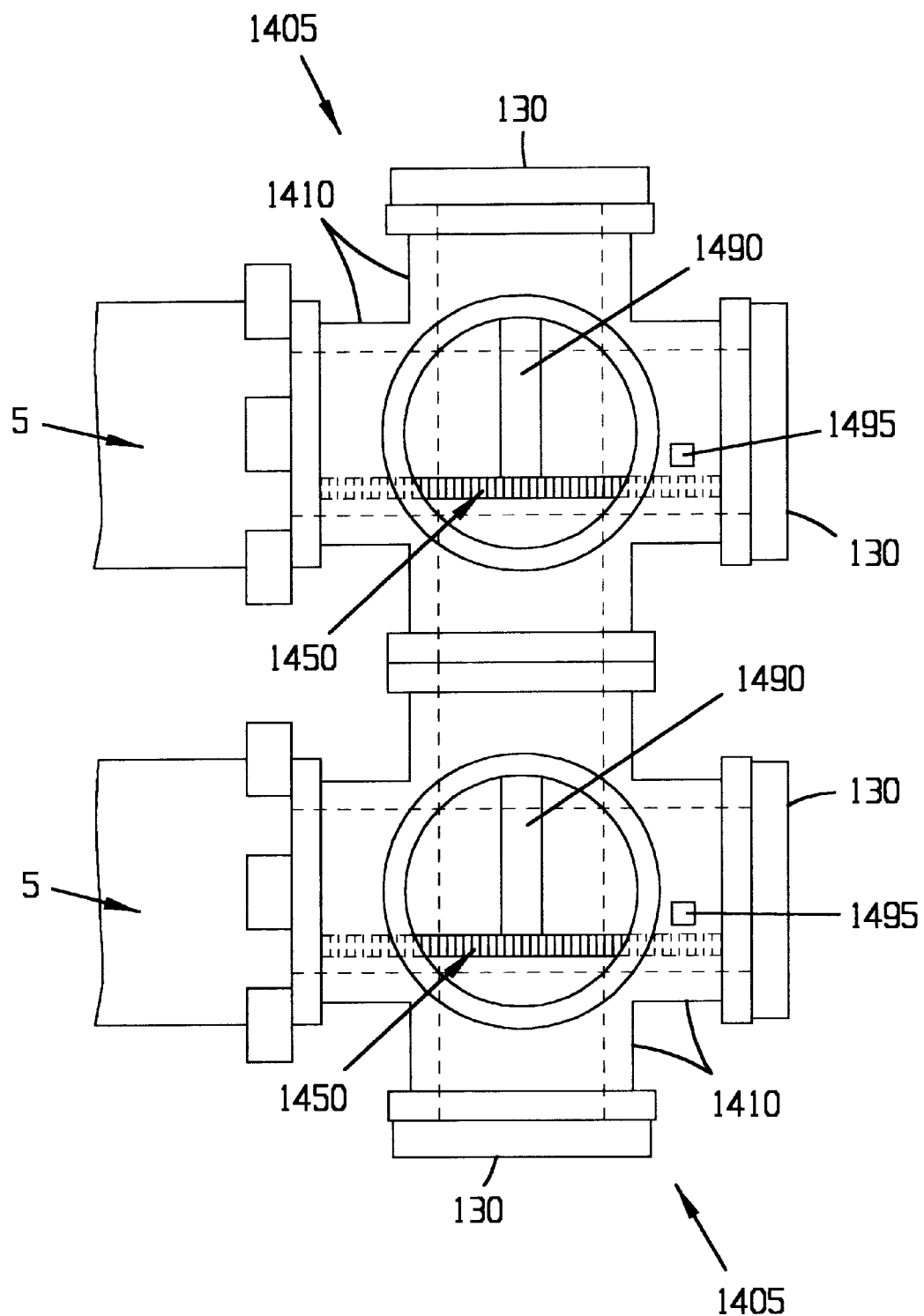
FIG. 13 is a perspective elevational view of yet another connecting chamber of one embodiment of the present invention.

Referring now to FIG. 13, a six-way interconnect chamber 1405 is shown. The six-way interconnect chamber 1405 includes three intersecting hollow cylindrical members 1410 that are all mutually perpendicular. Each hollow cylindrical member 1410 has opposed open ends 1425, 1430, 1426, 1431 and 1427, 1432, each oriented at 90° relative to any adjacent open end. The open ends 1425, 1430, 1426, 1431, and 1427, 1432 are sized to sealingly connect with either open end 25, 30 of a modular manufacturing environmental chamber 5 described above. No position members are required on the six-way interconnect chamber member 1405, since when in use, the chamber member 1405 is connected to at least two environmental chambers 5, each having cylinder position members 40, which provide support.

The interconnect chamber member 1405 contains a magnetically driven movement belt assembly 1450 which transfers work pieces from one interconnect chamber open end to any of the three other interconnect chamber open ends on a horizontal plane. The belt assembly 1450 is the same as the belt assembly 1250 described above for the four-way interconnect chamber 1205 and will not be described further. The track assembly 1450 is designed with a central elevator aperture 1480 present for installation of an elevator member 1490 to move work pieces vertically. The elevator member 1490 is any commercial third party elevator that meets requirements for clean environments, size and speed, with the elevator moving vertically in either direction to transfer work pieces from one chamber to another. A commercial third party robotic push arm member 1495 is mounted to the chamber inner wall to push work pieces to and from the elevator member 1490. Optionally, guide rails may be employed to control the path of the work pieces to and from the elevator member 1490. Of course, a second interconnect chamber member 1405 is mounted atop the first interconnect chamber member 1405 with an interconnecting elevator member 1490 for transferring work pieces between two environmental chambers 5 on separate levels. One or more of the interconnect chamber member open ends 1425, 1430, 1426, 1431, and 1427, 1432 can be sealed with an end cap 1433 as required, as shown in FIG. 13.

While the invention has been particularly shown and described with reference to preferred embodiments thereof, it will be understood by those skilled in the art that various changes in form and details may be made therein without departing from the spirit and scope of the invention.

I claim:

1. A modular manufacturing environmental chamber comprising;
   (a) a hollow cylindrical member of selected diameter and length having an interior surface and an exterior surface, the cylindrical member with a longitudinal axis there through, the cylindrical member having first and second ends;
   (b) positioning members secured to the cylindrical member exterior surface adjacent each end thereof, the positioning members maintaining the cylindrical member in a static orientation;
   (c) a chamber conveyor assembly positioned within the hollow cylindrical member, the chamber conveyer assembly dividing the hollow cylindrical member interior into a conveyer system section and a controlled environment section, the chamber conveyer assembly adapted for moving items within the hollow cylindrical member parallel the longitudinal axis thereof in either direction;
   (d) a linear power and control bus member affixed on the cylindrical member interior surface within the controlled environment section, the linear power and control bus member parallel with the cylindrical member longitudinal axis, the linear power and control bus member in electrical communication within devices exterior the cylindrical member;
   (e) a mounting assembly positioned in the environmental controlled section of the hollow cylindrical member for positioning and securing processing components therein; and
   (f) means for sealing the hollow cylindrical member first and second ends to an ambient environment.

2. The environmental chamber according to claim 1 wherein the positioning members include a pair of block members, one block member at each end of the hollow cylindrical member, each block member having a mutually coplanar flat surface opposite the cylindrical member exterior surface for maintaining the cylindrical member in a static orientation on a support surface.

3. The environmental chamber according to claim 1 further comprising a sealing access panel comprising a removable radial section of the cylindrical member extending a portion of the cylindrical member length.

4. The environmental chamber according to claim 1 wherein the controlled environment section of the cylindrical member divided interior is of greater volume than the conveyer system section thereof.

5. The environmental chamber according to claim 1 wherein the chamber conveyor assembly positioned within the hollow cylindrical member comprises;
   (i) a planar material movement plate member sized to linearly divide the hollow cylindrical member interior into a conveyer system section and a controlled environment section by contacting the cylindrical member interior surface with two opposite edges of the plate member;

(ii) a pair of linear bumper rail members affixed in parallel on the cylindrical member interior surface and parallel with the cylindrical member longitudinal axis, for supporting the planar plate member;

(iii) a conveyer system secured to one surface of the planar plate member facing the conveyer system section; and (iv) a linear rail guide member affixed to the opposite surface of the linear plate member facing the controlled environment section, the linear rail guide member in parallel with the cylindrical member longitudinal axis.

6. The environmental chamber according to claim 1 wherein the mounting assembly comprises;

(i) a pair of linear elevational locking track members affixed in parallel and spaced apart relationship on the cylindrical member interior surface within the controlled environment section, the linear elevational locking track members parallel with the cylindrical member longitudinal axis; and (ii) a locking bar member with first and second ends, the locking bar member adapted to connect at the first end perpendicular to one linear elevational locking track member and at the second end perpendicular to the other linear elevational locking track member.

7. A modular manufacturing environmental chamber comprising;

(a) a hollow cylindrical member of selected diameter and length having an interior surface and an exterior surface, the cylindrical member with a longitudinal axis there through, the cylindrical member having first and second ends;

(b) positioning members secured to the cylindrical member exterior surface adjacent each end thereof, the positioning members maintaining the cylindrical member in a static orientation;

(c) a chamber conveyor assembly positioned within the hollow cylindrical member comprising;

(i) a planar material movement plate member sized to linearly divide the hollow cylindrical member interior into a conveyer system section and a controlled environment section by contacting the cylindrical member interior surface with two opposite edges of the plate member;

(ii) a pair of linear bumper rail members affixed in parallel on the cylindrical member interior surface and parallel with the cylindrical member longitudinal axis, for supporting the planar plate member;

(iii) a conveyer system secured to one surface of the planar plate member facing the conveyer system section;

(iv) a linear rail guide member affixed to the opposite surface of the linear plate member facing the controlled environment section, the linear rail guide member in parallel with the cylindrical member longitudinal axis;

(d) a linear power and control bus member affixed on the cylindrical member interior surface within the controlled environment section, the linear power and control bus member parallel with the cylindrical member longitudinal axis, the linear power and control bus member in electrical communication with devices exterior the cylindrical member; and (e) means for sealing the hollow cylindrical member first and second ends to an ambient environment.

8. The environmental chamber according to claim 7 wherein the positioning members include a pair of block members, one block member at each end of the hollow cylindrical member, each block member having a mutually coplanar flat surface opposite the cylindrical member exterior surface for maintaining the cylindrical member in a static orientation on a support surface.

9. The environmental chamber according to claim 7 wherein the positioning members include four pairs of block members, one block member of each pair at each end of the hollow cylindrical member, each pair of block members having mutually coplanar flat surfaces opposite the cylindrical member exterior surface, each block member flat surface opposite the cylindrical member exterior surface oriented at 90 degrees to an adjacent block member flat surface opposite the cylindrical member exterior surface, the block member flat surfaces opposite the cylindrical member for maintaining the cylindrical member in a static orientation relative to a support surface and to similar modular manufacturing environmental chambers.

10. The environmental chamber according to claim 7 further comprising a sealing access panel comprising a removable radial section of the cylindrical member extending a portion of the cylindrical member length.

11. The environmental chamber according to claim 7 wherein the planar material movement plate member extends the length of the hollow cylindrical member.

12. The environmental chamber according to claim 7 wherein the controlled environment section of the cylindrical member divided interior is of greater volume than the conveyer system section thereof.

13. The environmental chamber according to claim 7 further comprising a pair of linear elevational locking track members affixed in parallel and spaced apart relationship on the cylindrical member interior surface within the controlled environment section, the linear elevational locking track members parallel with the cylindrical member longitudinal axis.

14. The environmental chamber according to claim 13 further comprising a locking bar member with first and second ends, the locking bar member adapted to connect at the first end perpendicular to one linear elevational locking track member and at the second end perpendicular to the other linear elevational locking track member.

15. The environmental chamber according to claim 13 wherein the linear elevational locking track members include a plurality of mounting apertures therein.

16. The environmental chamber according to claim 15 wherein the locking bar member include at least one mounting peg member at each end thereof, the mounting peg members adapted to fit into one of said mounting apertures for securing said locking bar member to said locking track members.

17. The environmental chamber according to claim 13 wherein each of the pair of linear elevational locking track members includes a toothed edge opposite the cylindrical member interior surface, and at least one linear elevational locking track member of the pair includes a power strip member extending the length thereof.

18. The environmental chamber according to claim 17 wherein the locking bar member includes a DC stepping motor member secured to said locking bar member, the motor powered from the power strip on said at least one linear elevational locking track member, said stepping motor including a rotatable gear member engageable with said linear elevational locking track member toothed edge, said motor and attached gear member adapted for securing and moving said locking bar member attached thereto.

19. The environmental chamber according to claim 7 wherein the conveyer system provides movement of items on one side of the linear rail guide in one direction and movement of items on the opposite side of the linear rail guide member in an opposite direction.

20. The environmental chamber according to claim 19 wherein the conveyer system includes two individually controlled end conveyer units and an individually controlled central conveyer unit.

21. The environmental chamber according to claim 19 wherein the central conveyer unit includes an endless central conveyer belt member mounted on a set of pulleys, said pulleys with rotational axis perpendicular to the planar plate member, a stepping motor for rotating at least one pulley of said set, the pulleys axis in alignment with the linear rail guide member, said central conveyer belt member moving in one direction on one said of said rail member and in a opposite direction on the opposite side of said rail member.

22. The environmental chamber according to claim 21 wherein one end conveyer belt member of each end conveyer unit is aligned with the central control belt member on one side of the rail member and the other end conveyer belt member of each end unit is aligned with the central conveyer belt member on the opposite side of the rail member, and the direction of movement adjacent the plate member of each end conveyer belt member matches the direction of movement of the central conveyer belt member with which each end conveyer belt member is aligned.

23. The environmental chamber according to claim 22 wherein each conveyer belt member of the end and central units are fabricated from elastomeric materials having magnetic properties.

24. The environmental chamber according to claim 19 wherein each end conveyer unit includes two sets of pulley members, all mounted with pulley axis parallel the plate member, one end conveyer belt member mounted around each set of pulleys, a stepping motor for rotating at least one pulley in each set of pulleys, said motors causing each end conveyer belt member of an end unit to move in opposite directions.

25. A modular manufacturing environmental chamber assembly comprising;
 (a) a plurality of modular manufacturing environmental chambers including,
  (i) a hollow cylindrical member of selected diameter and length having an interior surface and an exterior surface, the cylindrical member with a longitudinal axis there through, the cylindrical member having first and second ends;
  (ii) positioning members secured to the cylindrical member exterior surface adjacent each end thereof, the positioning members maintaining the cylindrical member in a static orientation;
  (iii) a chamber conveyor assembly positioned within the hollow cylindrical member, the chamber conveyer assembly dividing the hollow cylindrical member interior into a conveyer system section and a controlled environment section, the chamber conveyer assembly adapted for moving items within the hollow cylindrical member parallel the longitudinal axis thereof in either direction; and
  (iv) a linear power and control bus member affixed on the cylindrical member interior surface within the controlled environment section, the linear power and control bus member parallel with the cylindrical member longitudinal axis, the linear power and control bus member in electrical communication with devices exterior the cylindrical member;
 (b) an interconnect chamber member having at least two open ends, each of said at least two open ends sealingly connected to one open end of a hollow cylindrical member of a modular manufacturing environmental chamber, the interconnect chamber member including an interconnect chamber conveyor assembly positioned within the interconnect chamber member, the interconnect chamber conveyor assembly adapted for moving items from one modular manufacturing environmental chamber, through the interconnect chamber member and to another modular manufacturing environmental chamber, the interconnect chamber conveyor assembly including,
  (i) a planar material movement plate member sized to linearly divide the linear hollow cylindrical member interior into a conveyer system section and a controlled environment section by contacting the linear cylindrical member interior surface with two opposite edges of the plate member;
  (ii) a pair of linear bumper rail members affixed in parallel on the linear cylindrical member interior surface and parallel with the linear cylindrical member longitudinal axis, for supporting the planar plate member;
  (iii) a conveyer system secured to one surface of the planar plate member facing the conveyer system section;
  (iv) a linear rail guide member affixed to the opposite surface of the linear plate member facing the controlled environment section, the linear rail guide member in parallel with the cylindrical member longitudinal axis; and
 (c) means for sealing the hollow cylindrical members ends opposite the interconnect chamber member to an ambient environment.

26. The modular manufacturing environmental chamber assembly according to claim 25 wherein, the chamber conveyor system secured to the planar plate member includes two individually controlled end conveyer units and an individually controlled central conveyer unit.

27. The environmental chamber according to claim 26 wherein the central conveyer unit includes an endless central conveyer belt member mounted on a set of pulleys, said pulleys with rotational axis perpendicular to the planar plate member, a stepping motor for rotating at least one pulley of said set, the pulleys axis in alignment with the linear rail guide member, said central conveyer belt member moving in one direction on one said of said rail member and in a opposite direction on the opposite side of said rail member.

28. The environmental chamber according to claim 26 wherein each end conveyer unit includes two sets of pulley members, all mounted with pulley axis parallel the plate member, one end conveyer belt member mounted around each set of pulleys, a stepping motor for rotating at least one pulley in each set of pulleys, said motors causing each end conveyer belt member of an end unit to move in opposite directions.

29. The modular manufacturing environmental chamber assembly according to claim 25 wherein, the interconnect chamber member includes two perpendicularly intersecting hollow cylindrical members in one plane, each cylindrical member with two open ends, and wherein the interconnect chamber conveyor assembly includes a magnetically driven movement belt assembly including a continuous belt member of magnetic material, the belt member slidably supported on a track member secured within the interconnect chamber, the track member consecutively routing the belt member to each adjacent open end of the interconnect chamber's two hollow cylindrical members; and a plurality of magnetic solenoids positioned below the track member and opposite the belt member, the magnetic solenoids controlled to move the belt member around the track member, thereby moving work pieces consecutively to each adjacent open end of the interconnect chamber's two hollow cylindrical members.

30. The modular manufacturing environmental chamber assembly according to claim 25 wherein, the interconnect chamber member includes three mutually perpendicular intersecting hollow cylindrical members, each cylindrical member with two open ends and wherein the interconnect chamber conveyor assembly includes a magnetically driven movement belt assembly including a continuous belt member of magnetic material, the belt member slidably supported on a track member secured within the interconnect chamber, the track member consecutively routing the belt member to each adjacent open end of the interconnect chamber's two hollow cylindrical members of a horizontal plane; a plurality of magnetic solenoids positioned below the track member and opposite the belt member, the magnetic solenoids controlled to move the belt member around the track member, thereby moving work pieces consecutively to each adjacent open end of the interconnect chamber's two hollow cylindrical members in a plane; and an elevator member positioned perpendicular to the magnetically driven continuous belt member and centered therein, the elevator member adapted for moving work pieces in a vertical direction relative to the magnetically driven continuous belt member.

* * * * *